(12) United States Patent
Robin et al.

(10) Patent No.: US 10,559,713 B2
(45) Date of Patent: Feb. 11, 2020

(54) MULTIPLE QUANTUM WELL LIGHT-EMITTING DEVICE

(71) Applicant: Commissariat à l'Énergie Atomique et aux Énergies Alternatives, Paris (FR)

(72) Inventors: Ivan-Christophe Robin, Grenoble (FR); Amélie Dussaigne, Saint Hilaire de la Cote (FR); Pierre Ferret, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 34 days.

(21) Appl. No.: 15/270,615

(22) Filed: Sep. 20, 2016

(65) Prior Publication Data

US 2017/0084781 A1 Mar. 23, 2017

(30) Foreign Application Priority Data

Sep. 21, 2015 (FR) ...................................... 15 58865

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0025* (2013.01); *H01L 33/24* (2013.01);
(Continued)

(58) Field of Classification Search
CPC ..... H01L 33/06; H01L 33/38; H01L 33/0025; H01L 33/24; H01L 33/30; H01L 2933/0033; H01L 2933/0016
See application file for complete search history.

(56) References Cited

U.S. PATENT DOCUMENTS

| 9,768,350 B2 * | 9/2017 | Bavencove ........... H01L 27/153 |
| 2005/0054004 A1 * | 3/2005 | Alivisatos .............. B82Y 15/00 |
| | | 435/7.1 |

(Continued)

OTHER PUBLICATIONS

French Search Report, dated Jul. 26, 2016, from related French Application No. 15/58865.

*Primary Examiner* — Hoang-Quan T Ho
(74) *Attorney, Agent, or Firm* — Wolf, Greenfield & Sacks, P.C.

(57) ABSTRACT

A light-emitting device including a substrate, three-dimensional semiconductor elements resting on the substrate, at least one shell at least partially covering the lateral walls of the semiconductor element, the shell including an active area having multiple quantum wells, and an electrode at least partially covering the shell, at least a portion of the active area being sandwiched between the electrode and the lateral walls of the semiconductor element. The active area includes an alternation of first semiconductor layers mainly including a first element and a second element and of second semiconductor layers mainly including the first element and the second element and further including a third element. In at least three of the layers, the mass concentration of the third element increases in the portion of the active layer as the distance to the substrate decreases.

12 Claims, 6 Drawing Sheets

(51) Int. Cl.
*H01L 33/24* (2010.01)
*H01L 33/30* (2010.01)
*H01L 33/38* (2010.01)

(52) U.S. Cl.
CPC .............. *H01L 33/30* (2013.01); *H01L 33/38* (2013.01); *H01L 2933/0016* (2013.01); *H01L 2933/0033* (2013.01)

(56) References Cited

U.S. PATENT DOCUMENTS

| | | | | |
|---|---|---|---|---|
| 2011/0175059 A1* | 7/2011 | Kahen | .................... | B82Y 10/00 257/14 |
| 2014/0264260 A1* | 9/2014 | Chang | .................. | H01L 33/005 257/13 |

* cited by examiner

MULTIPLE QUANTUM WELL LIGHT-EMITTING DEVICE

This application claims the priority benefit of French patent application number 15/58865, the content of which is hereby incorporated by reference in its entirety to the maximum extent allowable by law.

BACKGROUND

The present invention generally relates to light-emitting devices based on semiconductor materials and to methods of manufacturing the same. Light-emitting devices mean devices capable of converting an electric signal into an electromagnetic radiation.

DISCUSSION OF THE RELATED ART

A light-emitting device generally comprises an "active" layer, which is the layer from which most of the radiation supplied by the device is emitted. The active layer may comprise confinement means corresponding to multiple quantum wells. It then comprises an alternation of semiconductor layers of a first material and of semiconductor layers of a second material, each layer of the first semiconductor material being sandwiched between two layers of the second semiconductor material, the first semiconductor material having a band gap lower than that of the second semiconductor material.

There exist light-emitting devices of two-dimensional structure which are formed by a stacking of substantially planar semiconductor layers. There further exist light-emitting devices of three-dimensional structure, particularly of radial type, comprising three-dimensional semiconductor elements and for which the active area is formed at the periphery of each three-dimensional element.

The internal quantum efficiency of the active area is equal to the ratio of the number of photons created in the active area to the number of carriers crossing the active area. The internal quantum efficiency is a unit-less number which varies between 0 and 1.

For an active area with quantum wells having the same composition, the internal quantum efficiency of the active area of a light-emitting device having a radial-type three-dimensional structure is lower than the internal quantum efficiency of the active area of a light-emitting device of two-dimensional structure.

SUMMARY

Thus, an object of an embodiment is to overcome at least part of the disadvantages of previously-described light-emitting devices having a radial-type three-dimensional structure and of their manufacturing methods.

Another object of an embodiment is to increase the internal quantum efficiency of the active area of the light-emitting device.

Another object of an embodiment is for the active area of the light-emitting device to comprise a stack of semiconductor materials based on III-V or II-VI compounds.

Thus, an embodiment provides a light-emitting device comprising:
a substrate;
three-dimensional semiconductor elements resting on the substrate;
for each semiconductor element, at least one shell at least partially covering the lateral walls of the semiconductor element, the shell comprising an active area having multiple quantum wells; and
an electrode at least partially covering the shell, at least a portion of the active area being sandwiched between the electrode and the lateral walls of the semiconductor element,
wherein the active area comprises an alternation of first semiconductor layers mainly comprising a first element and a second element and of second semiconductor layers mainly comprising the first element and the second element and further comprising a third element, and wherein, in at least three of the second layers, the mass concentration of the third element increases in said portion of the active area as the distance to the substrate decreases.

According to an embodiment, the mass concentration increase of the third element is in the range from 0.1 percentage point and 9 percentage points.

According to an embodiment, in each of said three second layers, in any portion of the second layer having its height equal to 10% of the height of said portion of the active area measured along a direction perpendicular to a surface of the substrate, the variation of the mass concentration of the third element between the ends, along said direction, of this portion is smaller than 50% of the variation of the mass concentration of the third element between the ends, along said direction, of said portion of the active area.

According to an embodiment, the mass concentration increase of the third element is linear.

According to an embodiment, each first layer mainly comprises a III-V binary compound and each second layer comprises the III-V compound wherein the III-type element is partly substituted with the third element.

According to an embodiment, the average mass concentration of said third element in the second layers is in the range from 6% to 25%.

According to an embodiment, for at least one of the semiconductor elements, the electrode only partly covers the shell covering said semiconductor element.

According to an embodiment, for at least one of the semiconductor elements, the average external diameter of the active area increases as the distance from the substrate increases.

According to an embodiment, the semiconductor elements are nanowires, microwires, and/or nanometer- or micrometer-range pyramid-shaped structures.

An embodiment also provides a method of manufacturing a light-emitting device, comprising the steps of:
forming three-dimensional semiconductor elements resting on a substrate;
forming, for each semiconductor element, at least one shell at least partially covering the lateral walls of the semiconductor element, the shell comprising an active area having multiple quantum wells; and
forming an electrode at least partially covering the shell, at least a portion of the active layer being sandwiched between the electrode and the lateral walls of the semiconductor element,
wherein the active area comprises an alternation of first semiconductor layers mainly comprising a first element and a second element and of second semiconductor layers mainly comprising the first element and the second element and further comprising a third element, and wherein, in at least three of the second layers, the mass concentration of the third element increases in said portion of the active area as the distance to the substrate decreases.

According to an embodiment, the method comprises, for at least one of the semiconductor elements, on forming of said at least three second layers, maintaining a temperature gradient between the end of the semiconductor element most distant from the substrate and the end of the semiconductor element closest to the substrate.

According to an embodiment, the method comprises, for at least one of the semiconductor elements, before the forming of said at least three second layers, the forming of the semiconductor element or of a layer covering the semiconductor element having a greater average external diameter at the end of the semiconductor element most distant from the substrate than at the end of the semiconductor element closest to the substrate.

The foregoing and other features and advantages will be discussed in detail in the following non-limiting description of specific embodiments in connection with the accompanying drawings.

DETAILED DESCRIPTION

Figure 1:
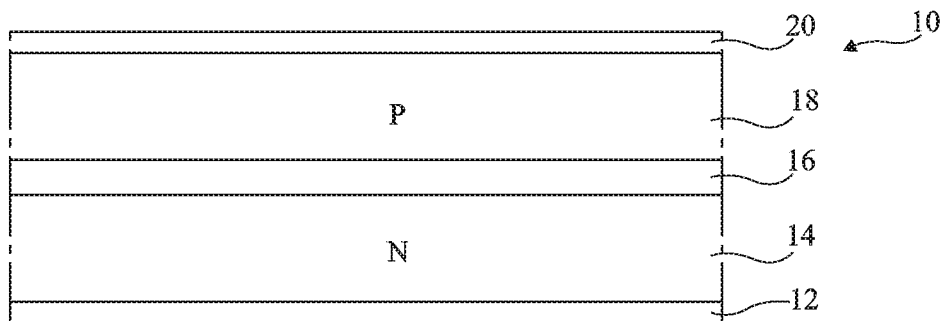
FIG. 1 is a partial simplified cross-section view of an example of a light-emitting device having a two-dimensional structure.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the light-emitting devices described hereafter are within the abilities of those skilled in the art and are not described. In the following description, unless otherwise indicated, terms "substantially", "approximately", and "in the order of" mean "to within 10%".

The present invention relates to a light-emitting device comprising an active area with multiple quantum wells. The active area comprises an alternation of semiconductor layers having a wide band gap, also called wide-gap semiconductor layers, and of semiconductor layers having a narrow band gap, also called narrow-gap semiconductor layers, each narrow-gap semiconductor layer being sandwiched between two wide-gap semiconductor layers. As an example, each wide-gap semiconductor layer mainly comprises a binary compound comprising at least a first group-III element and a second group-V element, called III-V compound hereafter. As an example, each narrow-gap semiconductor layer comprises a ternary compound comprising a third element in addition to the first group-III element and to the second group-V element.

Examples of group-III elements comprise gallium (Ga), indium (In), or aluminum (Al). Examples of group-V elements comprise nitrogen, phosphorus, or arsenic. Examples of binary and ternary III-N compounds are GaN, AlN, InN, InGaN, AlGaN, or AlInGaN. Generally, the elements in the III-V compound may be combined with different molar fractions. In the case of a III-V compound, the third element may correspond to a group-III element other than the first element.

There exist light-emitting devices having a two-dimensional structure where the active area is formed of one or of a plurality of substantially planar layers.

FIG. 1 is a cross-section view of an example of a light-emitting device 10 having a two-dimensional structure. Device 10 comprises, from bottom to top in FIG. 1:
a first biasing electrode 12;
a doped semiconductor layer 14 of a first conductivity type, for example, N-type doped;
an active layer 16;
a doped semiconductor layer 18 of a second conductivity type, for example, P-type doped; and
a second biasing electrode 20.

When a voltage is applied between electrodes 20 and 12, a light radiation is emitted by active area 16.

Figure 2:
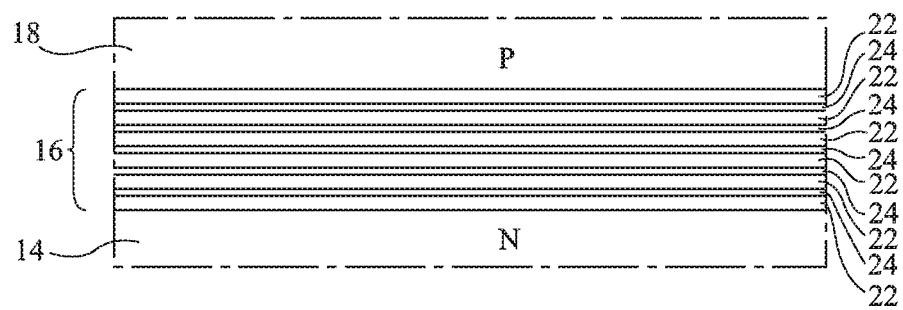
FIG. 2 is an enlarged partial simplified view of a portion of FIG. 1.

FIG. 2 shows an enlarged view of FIG. 1 in the case where active area 16 comprises multiple quantum wells. Active layer 16 is for example formed of an alternation of wide-gap layers 22, for example, made of GaN, and of narrow-gap layers 24, for example, made of InGaN, six wide-gap layers 22 and five narrow-gap layers 24 being shown as an example in FIG. 2. Wide-gap layers 22 may be doped, for example, N- or P-type doped, or undoped.

The present disclosure relates to light-emitting devices having a radial-type three-dimensional structure where the active area is formed on semiconductor elements having the shape of microwires, of nanowires, or of pyramids.

Term "microwire" or "nanowire" designates a three-dimensional structure of elongated shape, for example, cylindrical, conical, or tapered, along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 μm, preferably in the range from 100 nm to 1 μm, more preferably from 100 nm to 800 nm. In certain embodiments, the height of each microwire or nanowire may be greater than or equal to 500 nm, preferably in the range from 1 μm to 50 μm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter. The base of the wire for example has an oval, circular, or polygonal shape, particularly triangular, rectangular, square, or hexagonal. The diameter of a wire of circular base having the same surface area as the surface area of the base of the considered wire is called average diameter of the wire.

In the following description, term pyramid or truncated pyramid designates a three-dimensional structure having a pyramidal shape. The pyramidal structure may be truncated, that is, the top of the cone is absent and replaced by a flat area. The base of the pyramid is inscribed within a polygon having a side dimension from 100 nm to 10 μm, preferably from 1 to 3 μm. The polygon forming the base of the pyramid may be a hexagon. The height of the pyramid between the base of the pyramid and the apex or the top plateau varies from 100 nm to 20 μm, preferably from 1 μm to 10 μm.

Figure 3:
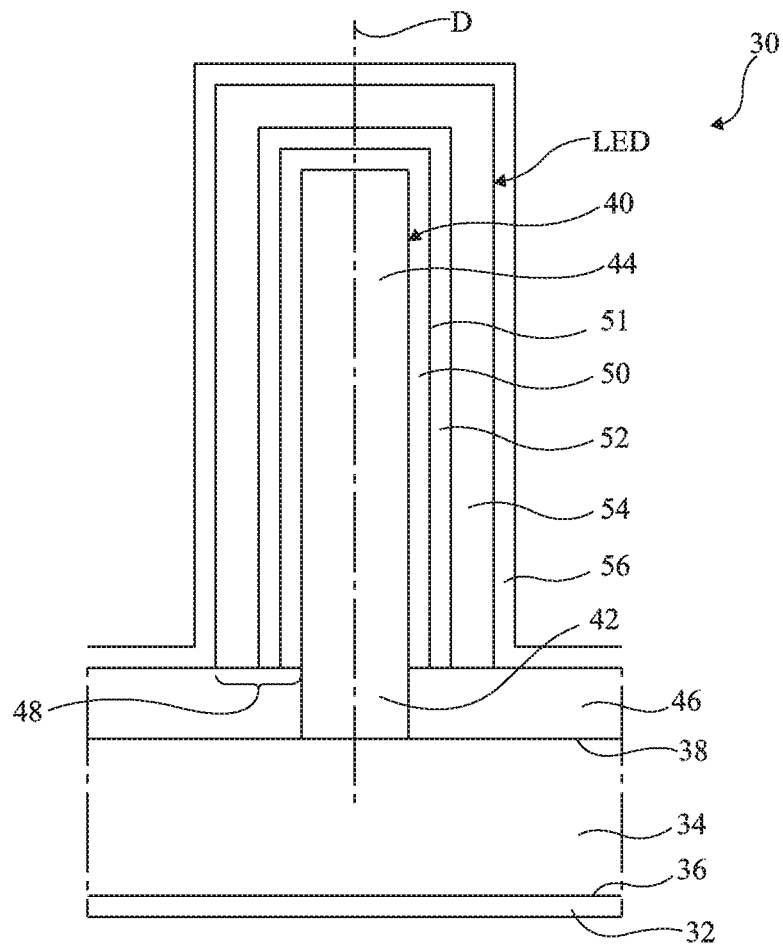
FIG. 3 is a partial simplified cross-section view of an embodiment of a light-emitting device having a radial-type three-dimensional structure.

FIG. 3 is a partial simplified cross-section view of an embodiment of a light-emitting device 30 formed from wires such as previously described and capable of emitting an electromagnetic radiation.

Device 30 comprises, from bottom to top in FIG. 3:
  a first biasing electrode 32;
  a substrate 34, for example, semiconductor, comprising parallel surfaces 36 and 38, surface 36 being in contact with electrode 32;
  semiconductor elements 40, which in the present embodiment correspond to wires, a single wire 40 of axis D being shown, each wire 40 being capable of comprising a lower portion 42, in contact with substrate 34, extending in an upper portion 44;
  an insulating layer 46 covering substrate 34 and the periphery of lower portion 42 of each wire 20;
  a shell 48 covering upper portion 44 of each wire 40, shell 48 comprising at least one stack of an interface layer 50 covering upper portion 44 and having an external lateral wall 51, of an active layer 52 covering interface layer 50, and of a semiconductor layer 54 covering active area 52; and
  a second electrode layer 56 covering each shell 48.

When a voltage is applied between electrodes 56 and 32, a light radiation is emitted by active area 52.

The assembly formed by a wire 40 and shell 48 forms a light-emitting diode LED. When a plurality of light-emitting diodes LED are formed on substrate 34, they may be connected in series and/or in parallel and form an assembly of light-emitting diodes. The assembly may comprise from a few light-emitting diodes LED to some thousand light-emitting diodes LED.

In the following description, one calls lower end of the useful portion of a layer of shell 48, also called useful lower end, the axial end closest to substrate 34 of the portion of this layer which is opposite second electrode 56, and one calls upper end of the useful portion of a layer of shell 48, also called useful upper end, the axial end most remote from substrate 34 of the portion of this layer which is opposite second electrode 56. In FIG. 3, second electrode 56 entirely covers shell 48. Thereby, the useful lower end of active area 52 is confounded with the axial end of active area 52 closest to substrate 34 and the useful upper end of active area 52 is confounded with the axial end of active area 52 most distant from substrate 34. As a variation, it is possible for second electrode 56 to only cover a portion of shell 48, for example, not to cover the base of shell 48 or the top of shell 48. In this case, the useful lower end of active area 52 may be different from the axial end of active area 52 closest to substrate 34 and the useful upper end of active area 52 may be different from the axial end of active area 52 most distant from substrate 34. In the following description, one calls useful height of active area 52 the height measured along axis D of the portion of active area 52 opposite second electrode 56.

Figure 4:
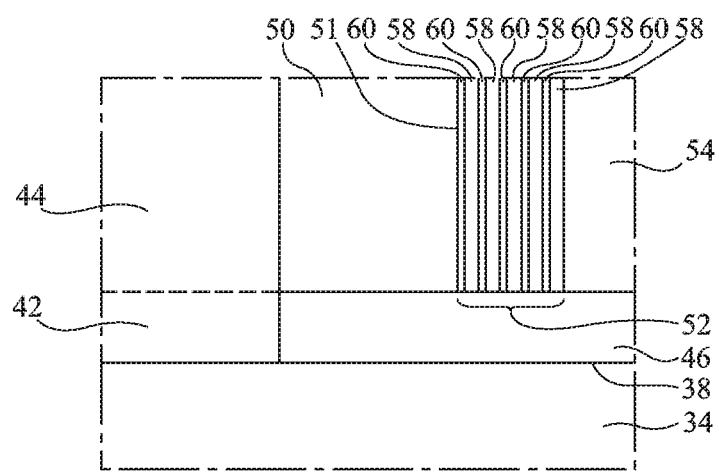
FIG. 4 is an enlarged partial simplified view of a portion of FIG. 3.

FIG. 4 shows an enlarged view of FIG. 3 in the case where active area 52 comprises multiple quantum wells. Active layer 52 is for example formed of an alternation of wide-gap layers 58, for example, made of GaN, and of narrow-gap layers 60, for example, made of InGaN, five wide-gap layers 58 and five narrow-gap layers 60 being shown as an example in FIG. 4. Wide-gap layers 58 may be doped, for example, N- or P-type doped, or undoped. Active area 52 may comprise from 3 to 20 narrow-gap layers 60.

Device 30 described in FIG. 3 operates properly but has disadvantages. Indeed, in the same conditions of use and for quantum wells having the same composition, the internal quantum efficiency of active area 52 of light-emitting device 30 is lower than the internal quantum efficiency of active area 16 of light-emitting device 10.

Figure 5:
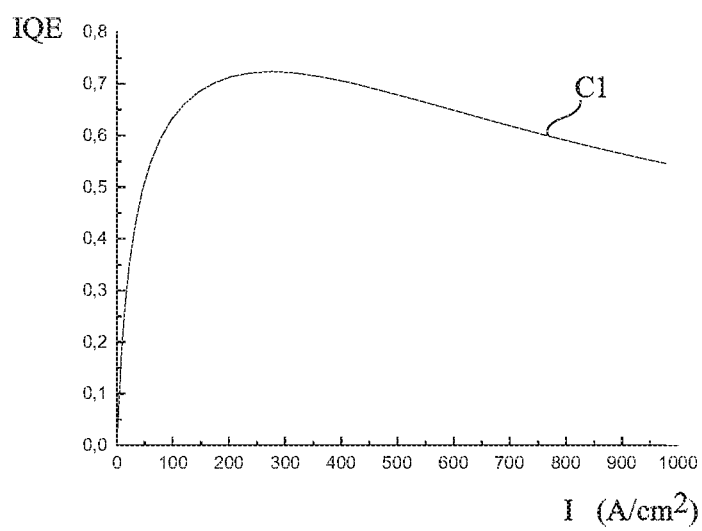
FIGS. 5 and 6 show curves of the variation of the internal quantum efficiency of the active area of the light-emitting devices respectively shown in FIG. 1 and in FIG. 3 according to the surface density of the current powering the device.

FIG. 5 shows a curve C1 of the variation, obtained by simulation, of internal quantum efficiency IQE of active area 16 of light-emitting device 10, such as shown in FIG. 2, according to the surface density of power supply current I supplied to electrode 20. For the simulation, layer 14 is an N-type doped GaN layer with a 1019 atoms/cm3 dopant concentration and layer 18 is a P-type doped GaN layer with a 1019 atoms/cm3 dopant concentration. Wide-gap layers 22 are non-intentionally doped GaN layers. The four wide-gap layers 22 closest to N-type layer 14 have a 5-nm thickness and the wide-gap layer 22 closest to P-type layer 18 has a 30-nm thickness. Narrow-gap layers 24 are non-intentionally doped In0.16Ga0.84N layers. As appears in FIG. 5, the maximum quantum efficiency is approximately 75%.

Figure 6:
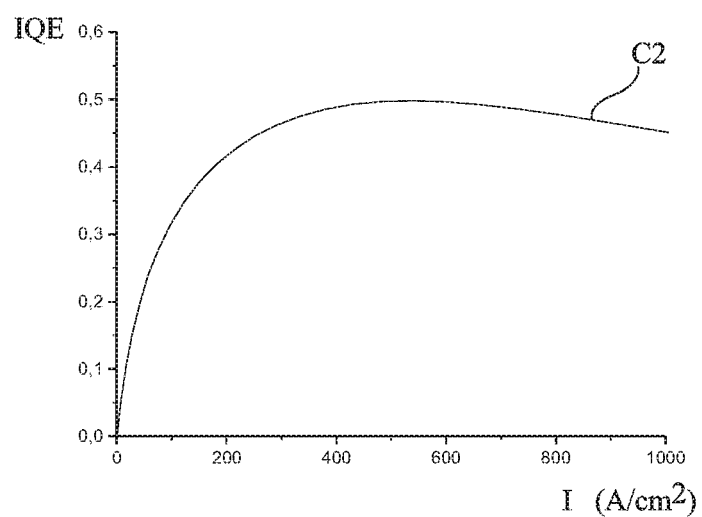
Figure 7:
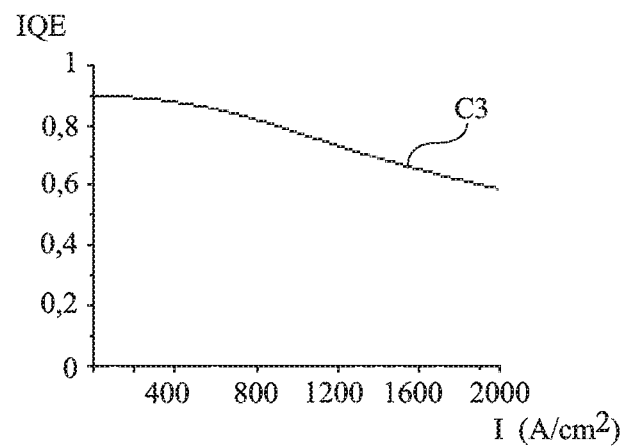
FIGS. 7 to 11 show curves of the variation of the internal quantum efficiency of the active area of the light-emitting device shown in FIG. 3 according to the surface density of the current powering the device for different mass concentrations of indium in the layers of the active area.
Figure 8:
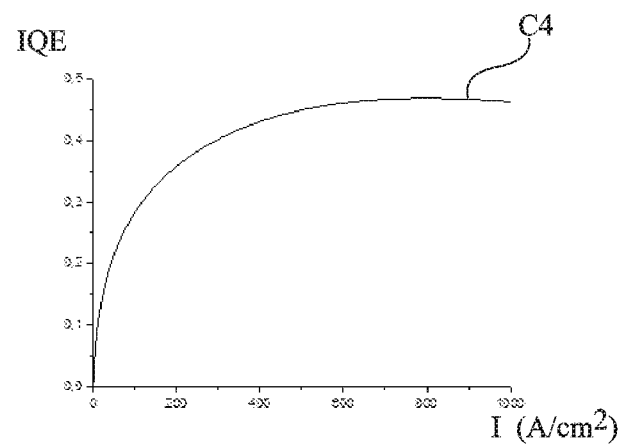
Figure 9:
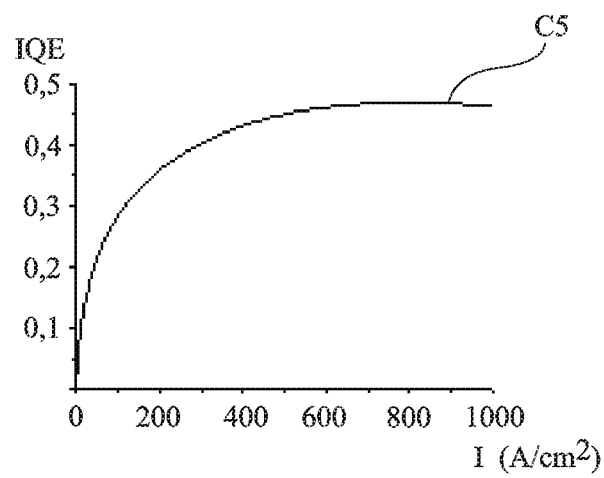
Figure 10:
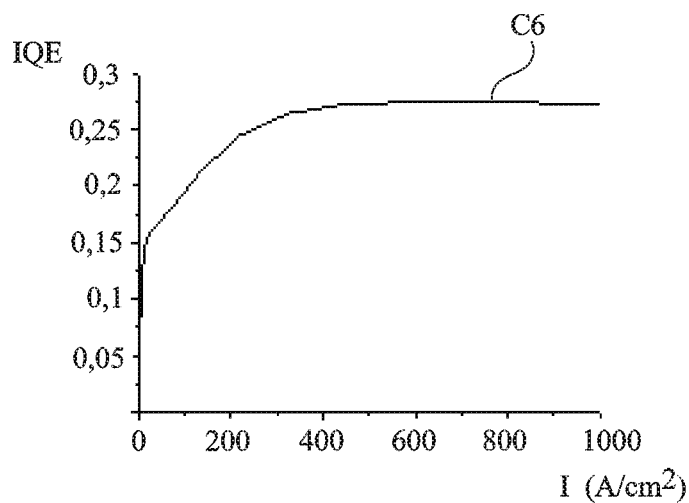
Figure 11:
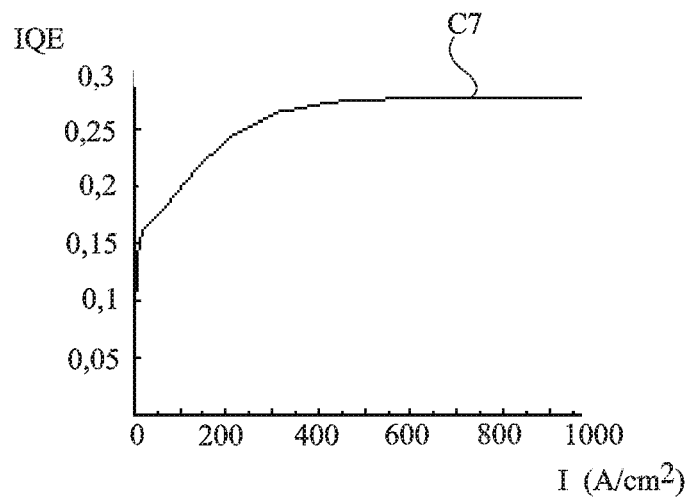

FIG. 6 shows an example of a curve C2 of the variation, obtained by simulation, of internal quantum efficiency IQE of active area 52 of light-emitting device 30, such as shown in FIG. 4, according to the surface density of power supply current I supplied to electrode 56. For the simulation, wire 40 is made of N-type doped GaN with a 1019 atoms/cm3 dopant concentration. Interface layer 50 is a non-intentionally doped GaN layer. Layer 54 is a P-type doped GaN layer with a 1019 atoms/cm3 dopant concentration. Wide-gap layers 58 are non-intentionally doped GaN layers. The four wide-gap layers 58 closest to interface layer 50 have a 5-nm thickness and the wide-gap layer 58 closest to P-type layer 54 has a 30-nm thickness. Narrow-gap layers 60 are non-intentionally doped In0.16Ga0.84N layers. The height, measured along axis D, of the lateral wall of wire 40 covered with shell 48 is 4 μm. As appears in FIG. 6, the maximum internal quantum efficiency is approximately 55% and is thus lower than the internal quantum efficiency of active area 16 of light-emitting device 10.

An explanation would be that, in the light-emitting device of two-dimensional structure 10, electrodes 12 and 20 are arranged symmetrically on either side of active area 16. This would cause a substantially homogeneous distribution of the current flowing through active area 16, and thus a homogeneous generation of light in active area 16. In the light-emitting device 30 of three-dimensional structure, electrodes 32 and 56 are thus not arranged symmetrically on either side of active area 52. The current would then tend to primarily follow the path having the lowest resistance, that is, by primarily flowing through the lower end of active area 52. There thus is no homogeneous distribution of the current in active area 52, which causes a decrease in the general emission of light by active area 52.

The inventors have shown that an increase in the quantity of emitted light can be obtained by varying the mass concentration of the third element in at least certain narrow-gap layers of active area 52 between the useful upper end of active area 52 and the useful lower end of active area 52.

According to an embodiment, for at least three narrow-gap layers 60, the mass concentration of the third element in the narrow-gap layer increases from the useful upper end to the useful lower end of the narrow-gap layer. Surprisingly, the inventors have shown that the internal quantum efficiency of active area 52 of the light-emitting device 30 of three-dimensional structure could even be greater than the internal quantum efficiency of active area 16 of same composition of the light-emitting device 10 of two-dimensional structure.

According to an embodiment, in each narrow-gap layer where the mass concentration of the third element varies, the difference between the maximum mass concentration of the third element at the useful lower end of the narrow-gap layer and the minimum mass concentration of the third element at the useful upper end of the narrow-gap layer is in the range from 0.1 percentage point to 9 percentage points, preferably from 1 percentage point to 9 percentage points.

According to an embodiment, in each narrow-gap layer where the mass concentration of the third element varies, the average mass concentration of the third element is in the range from 6% to 25%.

According to an embodiment, in each narrow-gap layer where the mass concentration of the third element varies, the mass concentration of the third element strictly grows from the useful lower end of the narrow-gap layer to the useful upper end of the narrow-gap layer. As an example, the variation of the mass concentration of the third element of the useful lower end to the useful upper end of the narrow-gap layer may be substantially linear.

According to an embodiment, in each narrow-gap layer where the mass concentration of the third element varies, a portion of the narrow-gap layer having a dimension, measured along axis D, equal to 10% of the useful height of the narrow-gap layer, is considered, the mass concentration variation of the third element between the lower axial end and the upper axial end of this portion is smaller than 50% of the mass concentration variation of the third element between the useful lower end and the useful upper end of the narrow-gap layer.

According to an embodiment, the thickness of each narrow-gap layer 60 is in the range from 1 nm to 10 nm. According to an embodiment, the thickness of each wide-gap layer 58 is in the range from 1 nm to 25 nm.

Substrate 34 may correspond to a monoblock structure or correspond to a layer covering a support made of another material. Substrate 34 is preferably a semiconductor substrate, for example, a substrate made of silicon, of germanium, of silicon carbide, of a III-V compound, such as GaN or GaAs, or a ZnO substrate. Preferably, substrate 34 is a single-crystal silicon substrate. Preferably, it is a semiconductor substrate compatible with the manufacturing methods implemented in microelectronics. Substrate 34 may correspond to a multilayer structure of silicon on insulator type, also called SOI. Substrate 34 may be heavily doped, lightly-doped or non-doped.

Electrode 32 may correspond to a conductive layer which extends on surface 36 of substrate 34. The material forming electrode 32 is, for example, nickel silicide (NiSi), aluminum (Al), aluminum silicide (AlSi), titanium (Ti), or titanium silicide (TiSi).

In the shown embodiment, semiconductor element 40 is in contact with surface 38 of substrate 34. As a variation, a seed layer made of a material favoring the growth of semiconductor elements 40 may be interposed between substrate 34 and semiconductor elements 40. As an example, the material forming the seed layer may be a nitride, a carbide, or a boride of a transition metal from column IV, V, or VI of the periodic table of elements or a combination of these compounds. As an example, seed layer may be made of aluminum nitride (AlN), of aluminum oxide (Al2O3), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum carbo-nitride (TaCN), of magnesium nitride in MgxNy form, where x is approximately equal to 3 and y is approximately equal to 2, for example, magnesium nitride according to form Mg3N2. The seed layer may be doped with the same conductivity type as substrate 34. The seed layer for example has a thickness in the range from 1 to 100 nanometers, preferably in the range from 10 to 30 nanometers. As a variation, the seed layer may be replaced with seed pads resting on surface 38 of substrate 34, each wire 40 resting on one of the seed pads.

Insulating layer 46 may be made of a dielectric material, for example, of silicon oxide (SiO2), of silicon nitride (SixNy, where x is approximately equal to 3 and y is approximately equal to 4, for example, Si3N4), of silicon oxynitride (particularly of general formula SiOxNy, for example, Si2ON2), of hafnium oxide (HfO2), or of diamond. As an example, the thickness of insulating layer 46 is in the range from 1 nm to 20 μm, preferably from 5 nm to 100 nm.

Semiconductor elements 40 are at least partly made of at least one semiconductor material. The semiconductor material is selected from the group comprising III-V compounds, II-VI compounds, or group-IV compounds. Examples of III-V compounds are those previously described for active area 52. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of binary and ternary II-VI compounds are ZnO, ZnMgO, CdZnO, CdZnMgO, CdHgTe, CdTe, or HgTe. Generally, the elements in the II-VI compound may be combined with different molar fractions. Examples of group-IV semiconductor materials are silicon (Si), carbon (C), germanium (Ge), silicon carbide alloys (SiC), silicon-germanium alloys (SiGe), or germanium carbide alloys (GeC).

Semiconductor elements 40 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

When the three-dimensional semiconductor elements 40 of the light-emitting device correspond to wires, the height of each wire may be in the range from 250 nm to 50 µm. Each wire 40 may have a semiconductor structure elongated along an axis D substantially perpendicular to surface 38. Each wire 40 may have a generally cylindrical shape with an oval, circular, or polygonal base, particularly triangular, rectangular, square, or hexagonal. The axes of two adjacent wires 40 may be distant by from 0.5 µm to 10 µm and preferably from 1.5 µm to 5 µm. As an example, wires 40 may be regularly distributed, particularly according to a hexagonal network.

According to an embodiment, lower portion 42 of each wire is mainly formed of a III-N compound, for example, gallium nitride, doped with a first conductivity type, for example, N-type doped. The N-type dopant may be silicon. The height of lower portion 42 may be in the range from 500 nm to 25 µm.

According to an embodiment, upper portion 44 of each wire is for example at least partly made of a III-N compound, for example, gallium nitride. Upper portion 44 may be doped with the first conductivity type, for example, type N, or not be intentionally doped. The height of upper portion 44 may be in the range from 500 nm to 25 µm.

When the three-dimensional semiconductor elements 40 of light-emitting device 30 correspond to pyramids, the height of each pyramid may be in the range from 100 nm to 25 µm. Each pyramid may have an elongated semiconductor structure along an axis substantially perpendicular to surface 38. The base of each pyramid may have a general shape of oval, circular, or polygonal type, particularly triangular, rectangular, square, or hexagonal. The centers of two adjacent pyramids may be distant by from 0.25 µm to 10 µm and preferably from 1.5 µm to 5 µm. As an example, the pyramids may be regularly distributed, particularly in a hexagonal network.

Semiconductor layer 54 may comprise a stack of a plurality of layers.

Electrode 56 is capable of biasing active area 52 covering each semiconductor element 40 and of letting through the electromagnetic radiation emitted by light-emitting diodes LED. The material forming electrode 56 may be a transparent and conductive material such as indium tin oxide (no), zinc oxide doped or not with aluminum or gallium, or graphene. As an example, electrode layer 56 has a thickness in the range from 5 nm to 200 nm, preferably from 20 nm to 50 nm.

FIGS. 7 to 11 show variation curves, respectively, C3, C4, C5, C6 and C7, obtained by simulation, of the internal quantum efficiency of active area 52 of light-emitting device 30 shown in FIG. 3 according to the surface density of power supply current I supplied to the electrode for different indium mass concentrations in narrow-gap layers 60. For these drawings, two simulations have been performed with the same parameters as those previously described to obtain curve C2, but for the fact that the mass concentration of indium in each narrow-gap layer 60 has been modified.

Table 1 hereafter gathers the parameters of the different simulations to obtain curves C3, C4, C5, C6, and C7 and indicates the maximum obtained internal quantum efficiency. Concentration Cmoy is equal to the average mass concentration of indium in narrow-gap layers 60. Concentration Ctop is equal to the mass concentration in narrow-gap layers 60 at the upper end of active area 52. Concentration Cbottom is equal to the mass concentration in narrow-gap layers 60 at the lower end of active area 52. Parameter Delta corresponds to the difference, expressed in percentage points, between the mass concentration of indium at the lower end of narrow-gap layers 60 and the upper end of narrow-gap layers 60. The mass concentration of indium varies linearly according to the position along axis D. The maximum internal quantum efficiency is noted IQEmax.

TABLE 1

| FIG. | Curve | Cmoy (%) | Ctop (%) | Cbottom (%) | Delta (percentage point) | IQEmax (%) |
|---|---|---|---|---|---|---|
| 7 | C3 | 14.5 | 13 | 16 | 3 | 90% |
| 8 | C4 | 14.5 | 16 | 13 | −3 | 55% |
| 9 | C5 | 10.05 | 20 | 0.1 | −19.05 | 45% |
| 10 | C6 | 13 | 25 | 1 | −24 | 25% |
| 11 | C7 | 13 | 1 | 25 | 24 | 25% |

For curve C3, the maximum quantum efficiency is 90%, that is, greater than the case where the light-emitting device has a two-dimensional structure. For curve C4, the maximum quantum efficiency is 55%, that is, of the same order as in the case where the mass concentration of indium is constant. For curve C5, C6, and C7, the maximum quantum efficiency is smaller than in the case where the mass concentration of indium is constant.

Figure 12:
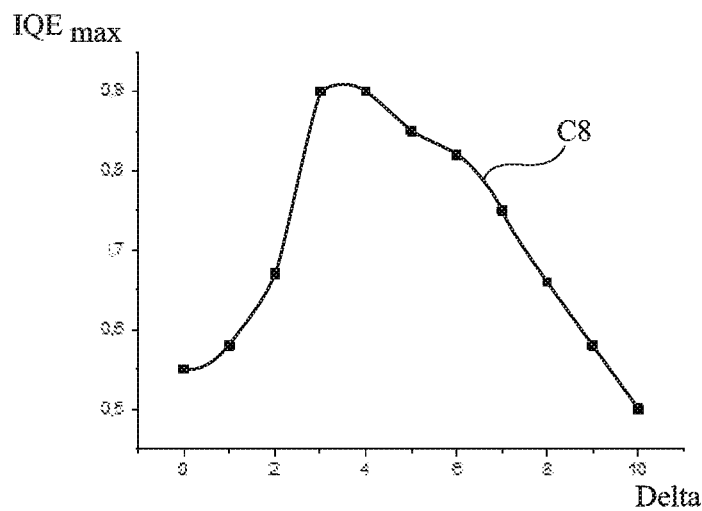
FIG. 12 shows a curve of the variation of the maximum internal quantum efficiency of the active area of the light-emitting device shown in FIG. 3 according to the difference, expressed in percentage points, between the maximum and minimum mass concentrations of indium in the active area.

FIG. 12 shows a curve C8 of the variation of the maximum internal quantum efficiency IQEmax of active area 52 of light-emitting device 30 shown in FIG. 3 according to interval Delta, expressed in percentage points, between the maximum mass concentration of indium in narrow-gap layers 60 at the lower end of active area 52 and the minimum mass concentration of indium in narrow-gap layers 60 at the upper end of active area 52.

An increase of the maximum internal quantum efficiency with respect to the case where the mass concentration of indium is constant is obtained when the concentration difference between the concentration at the lower end of active area 52 and the concentration at the upper end of active area 52, expressed in percentage points, is in the range from 0.1 percentage point to 9 percentage points, the concentration at the lower end of active area 52 being greater than the concentration at the upper end of active area 52.

Figure 13:
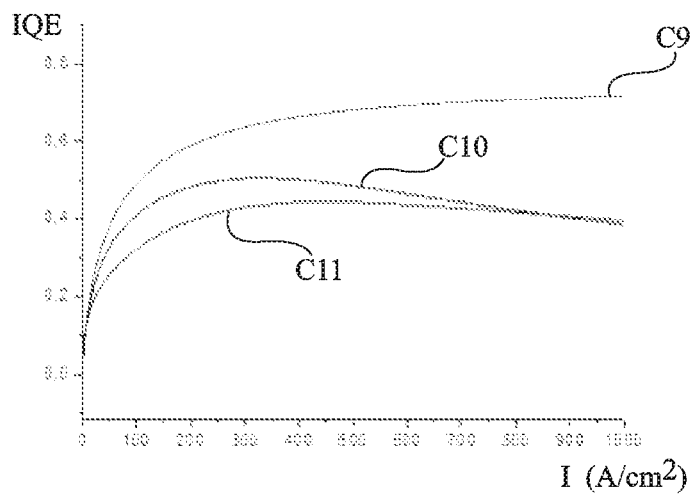
FIGS. 13 and 14 show curves of the variation of the internal quantum efficiency of the active area of the light-emitting device shown in FIG. 3 according to the surface density of the current powering the device for a plurality of indium mass concentration differences in the active area for an average indium mass concentration respectively of 10% and of 25%.
Figure 14:
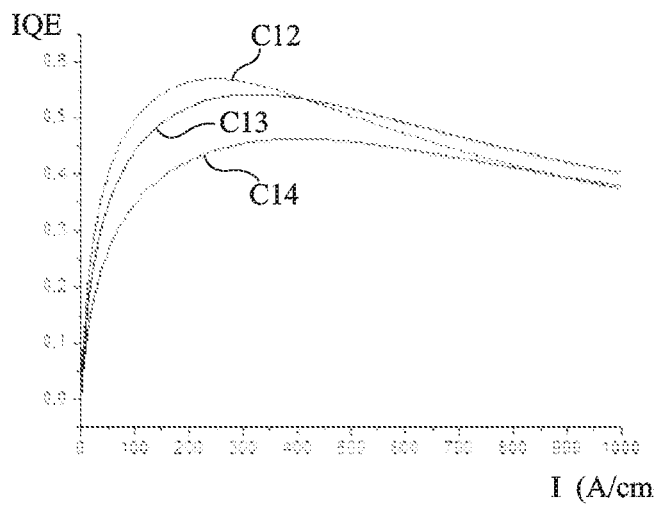

FIGS. 13 and 14 show variation curves C9, C10, C11, C12, C13, and C14, obtained by simulation, of the internal quantum efficiency of active area 52 of light-emitting device 30 shown in FIG. 3 according to the surface density of power supply current I supplied to the electrode for different indium mass concentrations in narrow-gap layers 60 and different average mass concentrations of indium in narrow-gap layers 60. For these drawings, the simulations have been performed with the same parameters as those previously described for the obtaining of curve C2, but for the fact that the mass concentration of indium in each narrow-gap layer 60 has been modified. In particular, for these simulations, the mass concentration of indium varies linearly according to the position along axis D.

Table 2 hereafter gathers the parameters of the different simulations to obtain curves C9, C10, C11, C12, C13, and C14 and indicates the maximum obtained internal quantum efficiency.

TABLE 2

| FIG. | Curve | Cmoy (%) | Ctop (%) | Cbottom (%) | Delta (percentage point) | IQEmax (%) |
|---|---|---|---|---|---|---|
| 13 | C9 | 10 | 8 | 12 | 4 | 0.7 |
| 13 | C10 | 10 | 10 | 10 | 0 | 0.5 |
| 13 | C11 | 10 | 12 | 8 | −4 | 0.43 |
| 14 | C12 | 25 | 23 | 27 | 4 | 0.57 |
| 14 | C13 | 25 | 25 | 25 | 0 | 0.53 |
| 14 | C14 | 25 | 27 | 23 | −4 | 0.45 |

Whatever the average mass concentration of indium, when the mass concentration of indium in narrow-gap layer 60 increases from the upper end to the lower end of active area 52, the maximum internal quantum efficiency is increased with respect to the case where the mass concentration of indium is substantially constant. Further, when the mass concentration of indium in narrow-gap layer 60 decreases from the upper end to the lower end of active area 52, the maximum internal quantum efficiency is decreased with respect to the case where the mass concentration of indium is substantially constant.

Figure 15:
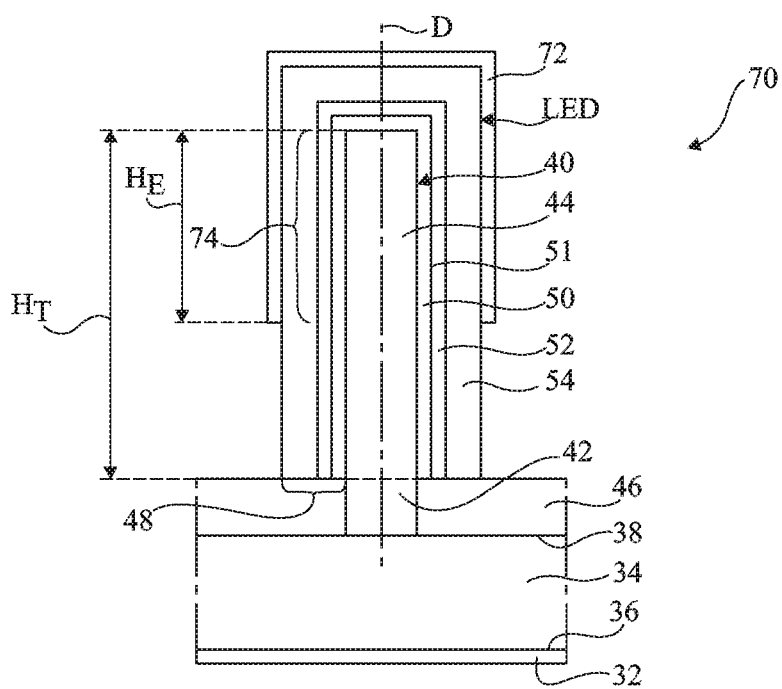
FIG. 15 is a partial simplified cross-section view of another embodiment of a light-emitting device having a radial-type three-dimensional structure.

FIG. 15 shows another embodiment of a light-emitting device 70. Light-emitting device 70 comprises all the elements of light-emitting device 30 shown in FIG. 3, with the difference that electrode 56 is replaced with an electrode 72 which does not totally covers the external lateral walls of shell 48. Preferably, electrode 72 extends along a height HE measured along axis D which is equal to a portion of total height HT of wire 40 covered with shell 48. Preferably, height HE is greater than or equal to 1 μm.

In this embodiment, the concentration variation of the third element in narrow-gap layers 60, in the range from 0.1 percentage point to 9 percentage points, is provided between the upper end and the lower end of portion 74 of active area 52 sandwiched between electrode 72 and the external lateral wall of interface layer 50. Indeed, the inventors have shown that the concentration variations of the third element in narrow-gap layers 60 outside of portion 74 of active area 52 have little influence upon the internal quantum efficiency of active area 52.

The method of growing each semiconductor element 40 and the layers forming shell 48 covering semiconductor element 40 may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

As an example, the method may comprise injecting into a reactor a precursor the first group-III element and a precursor of the second group-V element and, possibly, a precursor of the third element.

Figure 16:
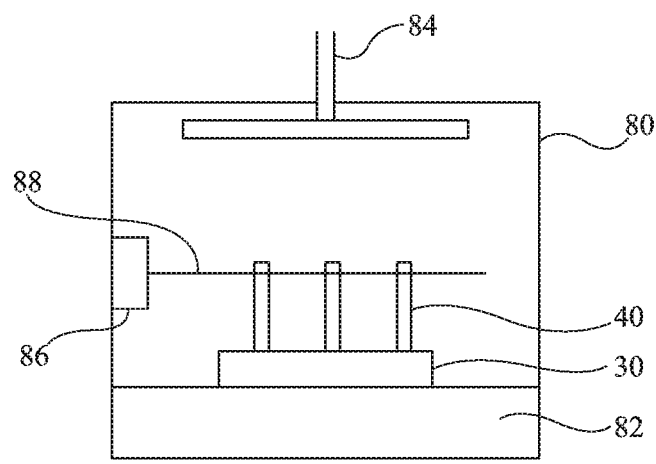
FIG. 16 is a partial simplified cross-section view of an embodiment of a reactor at one step of an embodiment of a method of manufacturing a light-emitting device having a radial-type three-dimensional structure.

FIG. 16 very schematically shows a reactor 80, for example, a MOCVD reactor for implementing an embodiment of a method of manufacturing light-emitting device 30 where a temperature gradient is applied to each semiconductor element 40 during the growth of narrow-gap layers 60 of active area 52, so that the upper end of semiconductor element 40 is at a higher temperature than the base of semiconductor element 40. The incorporation of indium into narrow-gap layer 60 during the growth is then all the more significant as the temperature of semiconductor element 40 is low. An indium concentration gradient along the axis of semiconductor element 40 is thus obtained. According to an embodiment, device 30 rests on a susceptor 82. Ducts 84 enable to feed precursor gases into reactor 80. To obtain a temperature gradient, a laser source 86 is capable of emitting a laser sheet 88 to heat the ends of wires 40.

Figure 17:
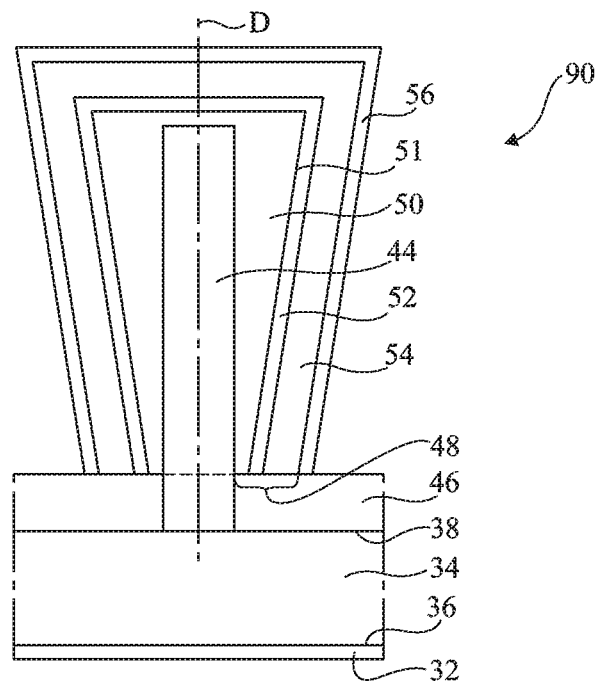
FIG. 17 is a partial simplified cross-section view of another embodiment of a light-emitting device having a radial-type three-dimensional structure.

FIG. 17 shows another embodiment of a light-emitting device 90. Light-emitting device 90 comprises all the elements of light-emitting device 30 shown in FIG. 3, with the difference that the average diameter of lateral wall 51 of interface layer 50 at the upper end of wire 40 is greater than the average diameter of lateral wall 51 of interface layer 50 at the lower end of wire 40.

An interface layer wider at the upper end of wire 10 may be obtained by varying the temperature in the reactor during the growth of interface layer 50. According to an embodiment, the temperature in the reactor is decreased during the growth of interface layer 50. During the growth of narrow-gap layers 60, the incorporation of indium is all the more significant as the diameter of narrow-gap layer 60 is small. An indium concentration which increases from the upper end of wire 40 to the lower end of wire 40 is thus obtained.

As a variation, the method of forming wires 40 is adapted so that the average diameter of each wire 40 at the upper end of wire 40 is greater than the average diameter of wire 40 at the lower end of wire 40.

Various embodiments with different variations have been described hereabove. It should be noted that those skilled in the art may combine various elements of these various embodiments and variations without showing any inventive step. In particular, light-emitting device 90 shown in FIG. 17 may be formed with an electrode 56 which does not totally cover shell 48 as is the case for light-emitting device 70 shown in FIG. 15.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A light-emitting device comprising:
a substrate;
three-dimensional semiconductor elements resting on the substrate;
for each semiconductor element, at least one shell at least partially covering lateral walls of the semiconductor element, the shell comprising an active area having multiple quantum wells; and
an electrode at least partially covering the shell, at least a portion of the active area being sandwiched between the electrode and the lateral walls of the semiconductor element,
wherein the active area comprises an alternation of first semiconductor layers mainly comprising a first element and a second element and of second semiconductor layers mainly comprising the first element and the second element and further comprising a third element, and wherein, in each of at least three of the second layers, mass concentration of the third element increases in said portion of the active area as a distance to the substrate decreases.

2. The light-emitting device of claim 1, wherein the mass concentration increase of the third element is in the range from 0.1 percentage point and 9 percentage points.

3. The light-emitting device of claim 1, wherein, in each of said three second layers, in any portion of the second layer having its height equal to 10% of the height of said portion of the active area measured along a direction perpendicular to a surface of the substrate, the variation of the mass concentration of the third element between the ends, along said direction, of this portion is smaller than 50% of the variation of the mass concentration of the third element between the ends, along said direction, of said portion of the active area.

4. The light-emitting device of claim 1, wherein the mass concentration increase of the third element is linear.

5. The light-emitting device of claim 1, wherein each first layer mainly comprises a III-V binary compound and each second layer comprises the III-V compound wherein the III-type element is partly substituted with the third element.

6. The light-emitting device of claim 1, wherein the average mass concentration of said third element in the second layers is in the range from 6% to 25%.

7. The light-emitting device of claim 1, wherein, for at least one of the semiconductor elements, the electrode only partly covers the shell covering said semiconductor element.

8. The light-emitting device of claim 1, wherein, for at least one of the semiconductor elements, the average external diameter of the active area increases as the distance from the substrate increases.

9. The light-emitting device of claim 1, wherein the semiconductor elements are nanowires, microwires, and/or nanometer- or micrometer-range pyramidal structures.

10. A method of manufacturing a light-emitting device, comprising the steps of:

forming three-dimensional semiconductor elements resting on a substrate;

forming, for each semiconductor element, at least one shell at least partially covering lateral walls of the semiconductor element, the shell comprising an active area having multiple quantum wells; and forming an electrode at least partially covering the shell, at least a portion of the active layer being sandwiched between the electrode and the lateral walls of the semiconductor element, wherein the active area comprises an alternation of first semiconductor layers mainly comprising a first element and a second element and of second semiconductor layers mainly comprising the first element and the second element and further comprising a third element, and wherein, in each of at least three of the second layers, mass concentration of the third element increases in said portion of the active area as a distance to the substrate decreases.

11. The method of claim 10, comprising, for at least one of the semiconductor elements, on forming of said at least three second layers, maintaining a temperature gradient between the end of the semiconductor element most distant from the substrate and the end of the semiconductor element closest to the substrate.

12. The method of claim 11, comprising, for at least one of the semiconductor elements, before the forming of said at least three second layers, the forming of the semiconductor element or of a layer covering the semiconductor element having a greater average external diameter at the end of the semiconductor element most distant from the substrate than at the end of the semiconductor element closest to the substrate.

* * * * *